United States Patent
Kobayashi et al.

(10) Patent No.: US 11,114,487 B2
(45) Date of Patent: Sep. 7, 2021

(54) PHOTOELECTRIC CONVERSION APPARATUS AND IMAGING SYSTEM USING THE SAME

(71) Applicant: CANON KABUSHIKI KAISHA, Tokyo (JP)

(72) Inventors: Masahiro Kobayashi, Tokyo (JP); Yuichiro Yamashita, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/908,377

(22) Filed: Jun. 22, 2020

(65) Prior Publication Data

US 2020/0321372 A1 Oct. 8, 2020

Related U.S. Application Data

(60) Continuation of application No. 16/696,414, filed on Nov. 26, 2019, now Pat. No. 10,727,266, which is a continuation of application No. 16/356,676, filed on Mar. 18, 2019, now Pat. No. 10,636,828, which is a division of application No. 15/207,289, filed on Jul.

(Continued)

(30) Foreign Application Priority Data

May 9, 2008 (JP) ................ 2008-123440

(51) Int. Cl.
*H01L 27/146* (2006.01)
*H04N 5/3745* (2011.01)

(52) U.S. Cl.
CPC .... *H01L 27/1463* (2013.01); *H01L 27/14603* (2013.01); *H01L 27/14609* (2013.01); *H01L 27/14612* (2013.01); *H01L 27/14623* (2013.01); *H04N 5/37452* (2013.01); *H04N 5/37457* (2013.01)

(58) Field of Classification Search
CPC ......... H01L 27/14603; H01L 27/14612; H01L 27/14623; H01L 27/14609; H01L 27/1463; H04N 5/37452; H04N 5/37457
See application file for complete search history.

(56) References Cited

U.S. PATENT DOCUMENTS 3,648,125 A 3/1972 Peltzer
5,401,998 A 3/1995 Chiu
(Continued)

FOREIGN PATENT DOCUMENTS

JP 2003-87663 A 3/2003
JP 2005-167588 6/2005
(Continued)

OTHER PUBLICATIONS

India Office Action dated Dec. 8, 2016 during prosecution of related India application No. 7897/CHENP/2010. (Previously cited during prosecution of parent U.S. Appl. No. 16/696,414.).

*Primary Examiner* — John R Lee
(74) *Attorney, Agent, or Firm* — Venable LLP

(57) ABSTRACT

In a photoelectric conversion apparatus including charge storing portions in its imaging region, isolation regions for the charge storing portions include first isolation portion each having a PN junction, and second isolation portions each having an insulator. A second isolation portion is arranged between a charge storing portion and at least a part of a plurality of transistors.

53 Claims, 8 Drawing Sheets

Related U.S. Application Data 11, 2016, now Pat. No. 10,283,546, which is a division of application No. 13/797,276, filed on Mar. 12, 2013, now Pat. No. 9,419,038, which is a division of application No. 12/989,556, filed as application No. PCT/JP2009/058949 on May 7, 2009, now Pat. No. 8,552,353.

(56) References Cited

U.S. PATENT DOCUMENTS

| | | | |
|---|---|---|---|
| 5,970,316 A | 10/1999 | Merrill | |
| 6,885,047 B2 | 4/2005 | Shinohara | |
| 7,205,627 B2 | 4/2007 | Adkisson | |
| 7,422,924 B2 | 9/2008 | Rhodes | |
| 7,462,810 B2 | 12/2008 | Kobayashi | |
| 7,623,056 B2 | 11/2009 | Yamashita | |
| 7,633,539 B2 | 12/2009 | Yamashita | |
| 7,800,675 B2 | 9/2010 | Shah | |
| 7,817,199 B2 | 10/2010 | Yamashita | |
| 7,875,915 B2 | 1/2011 | Roy | |
| 8,072,520 B2 | 12/2011 | Rysinski | |
| 8,354,693 B2 | 1/2013 | Mori | |
| 8,441,564 B2 | 4/2013 | Yamashita | |
| 8,552,353 B2 | 10/2013 | Kobayashi | |
| 8,686,481 B2 | 4/2014 | Maas | |
| 9,245,919 B2 | 1/2016 | Yamashita | |
| 9,419,038 B2 | 8/2016 | Kobayashi | |
| 9,865,631 B2 | 1/2018 | Yamashita | |
| 10,283,546 B2 | 5/2019 | Kobayahshi | |
| 10,373,999 B2* | 8/2019 | Yamashita | H01L 27/14636 |
| 10,418,398 B2* | 9/2019 | Kobayashi | H01L 27/14614 |
| 10,483,307 B2 | 11/2019 | Sekine | |
| 10,504,947 B2* | 12/2019 | Minowa | H01L 27/14636 |
| 10,510,789 B2* | 12/2019 | Chen | H01L 27/14643 |
| 10,636,828 B2* | 4/2020 | Kobayashi | H04N 5/37452 |
| 10,636,930 B2* | 4/2020 | Yamashita | H01L 31/02327 |
| 10,672,934 B2* | 6/2020 | Wang | H01L 31/107 |
| 10,692,914 B2* | 6/2020 | Kalnitsky | H01L 27/1464 |
| 10,700,117 B2* | 6/2020 | Yamashita | H01L 27/14638 |
| 10,727,266 B2* | 7/2020 | Kobayashi | H01L 27/14623 |
| 2003/0038336 A1 | 2/2003 | Mann | |
| 2004/0000681 A1 | 1/2004 | Shinohara | |
| 2004/0094784 A1 | 5/2004 | Rhodes | |
| 2004/0178430 A1 | 9/2004 | Rhodes | |
| 2004/0206991 A1 | 10/2004 | Yato | |
| 2004/0217436 A1 | 11/2004 | Kimura | |
| 2004/0262646 A1 | 12/2004 | Patrick | |
| 2005/0045925 A1 | 3/2005 | Yoshida | |
| 2005/0263804 A1 | 12/2005 | Yoshihara | |
| 2006/0044243 A1 | 3/2006 | Rysinski | |
| 2006/0044437 A1 | 3/2006 | Shah | |
| 2006/0124977 A1 | 6/2006 | Shinohara | |
| 2006/0146156 A1 | 7/2006 | Toros | |
| 2006/0255371 A1 | 11/2006 | Roy | |
| 2006/0258042 A1 | 11/2006 | Roy | |
| 2007/0031987 A1 | 2/2007 | Mouli | |
| 2007/0045679 A1 | 3/2007 | McKee | |
| 2007/0072325 A1 | 3/2007 | Rhodes | |
| 2007/0158713 A1 | 7/2007 | Ohkawa | |
| 2007/0235827 A1 | 10/2007 | Altice | |
| 2008/0029787 A1 | 2/2008 | Watanabe | |
| 2008/0197386 A1 | 8/2008 | Maas | |
| 2008/0303058 A1 | 12/2008 | Mori | |
| 2009/0050787 A1 | 2/2009 | Kobayashi | |
| 2009/0096901 A1 | 4/2009 | Bae | |
| 2009/0244328 A1 | 10/2009 | Yamashita | |
| 2009/0251578 A1 | 10/2009 | Yamashita | |
| 2009/0256176 A1 | 10/2009 | Kobayashi | |
| 2009/0284632 A1 | 11/2009 | Onuki | |
| 2009/0303364 A1 | 12/2009 | Shibata | |
| 2010/0053398 A1 | 3/2010 | Yamashita | |
| 2010/0165167 A1 | 7/2010 | Sugiyama | |
| 2010/0200738 A1 | 8/2010 | Yamashita | |
| 2010/0289931 A1 | 11/2010 | Shibata | |
| 2010/0328302 A1 | 12/2010 | Yamashita | |
| 2010/0328509 A1 | 12/2010 | Yamashita | |
| 2011/0032379 A1 | 2/2011 | Kobayashi | |
| 2013/0187210 A1 | 7/2013 | Kobayashi | |
| 2016/0322406 A1 | 11/2016 | Yamashita | |
| 2019/0214414 A1* | 7/2019 | Chen | H01L 27/1464 |
| 2019/0214415 A1 | 7/2019 | Kobayashi | |
| 2019/0355775 A1* | 11/2019 | Yamashita | H01L 27/1463 |
| 2020/0066770 A1* | 2/2020 | Chen | H01L 27/1463 |
| 2020/0075645 A1* | 3/2020 | Minowa | H01L 27/14607 |
| 2020/0098800 A1* | 3/2020 | Kobayashi | H01L 27/1463 |
| 2020/0227582 A1* | 7/2020 | Yamashita | H01L 27/14643 |
| 2020/0279969 A1* | 9/2020 | Wang | H01L 27/1469 |
| 2020/0303431 A1* | 9/2020 | Kalnitsky | H01L 27/1464 |
| 2020/0303433 A1* | 9/2020 | Yamashita | H01L 27/1462 |
| 2020/0321372 A1* | 10/2020 | Kobayashi | H01L 27/14603 |

FOREIGN PATENT DOCUMENTS

| | | |
|---|---|---|
| JP | 2005-347325 | 12/2005 |
| JP | 2007-053217 | 3/2007 |
| JP | 2007-157912 | 6/2007 |
| WO | 2006/117725 | 11/2006 |

* cited by examiner

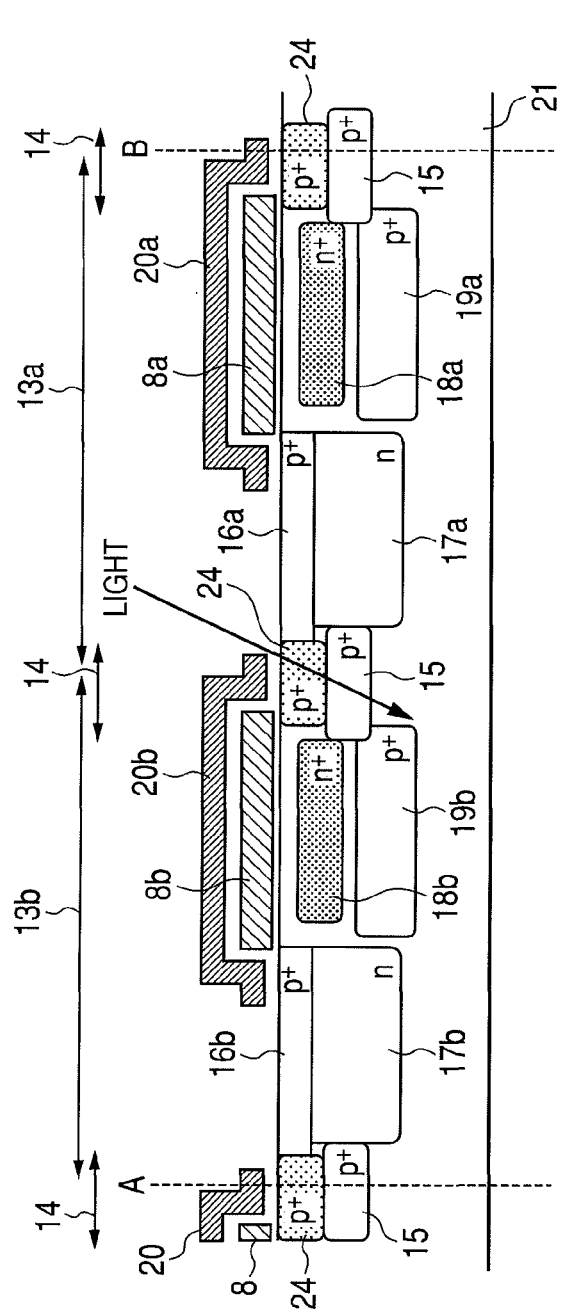
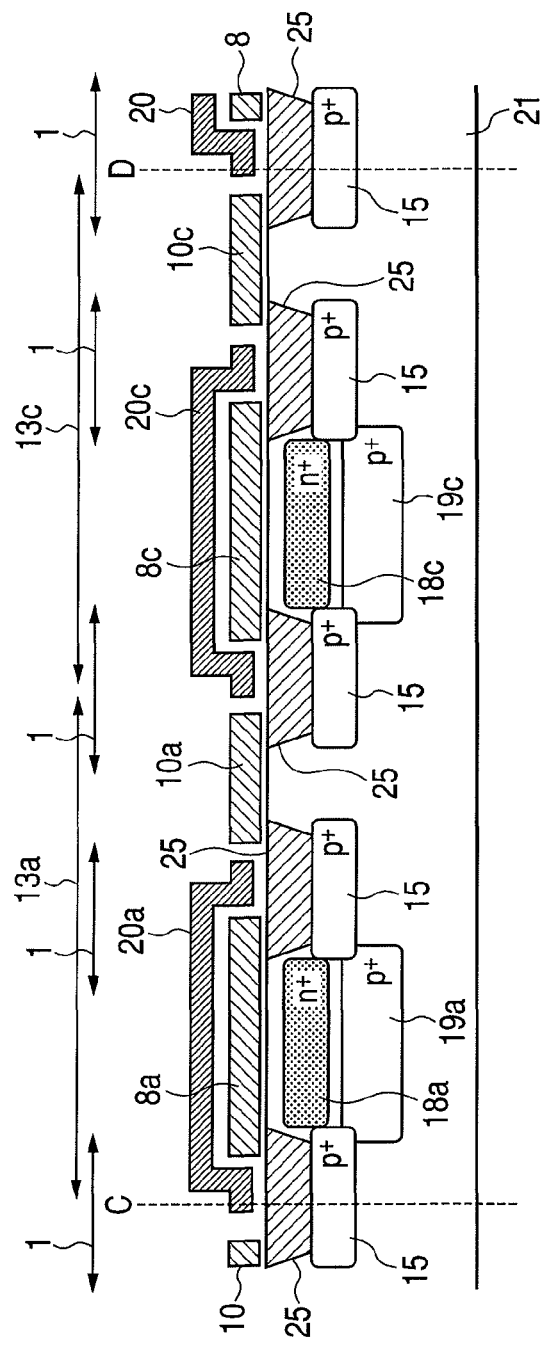
FIG. 3A
FIG. 3B

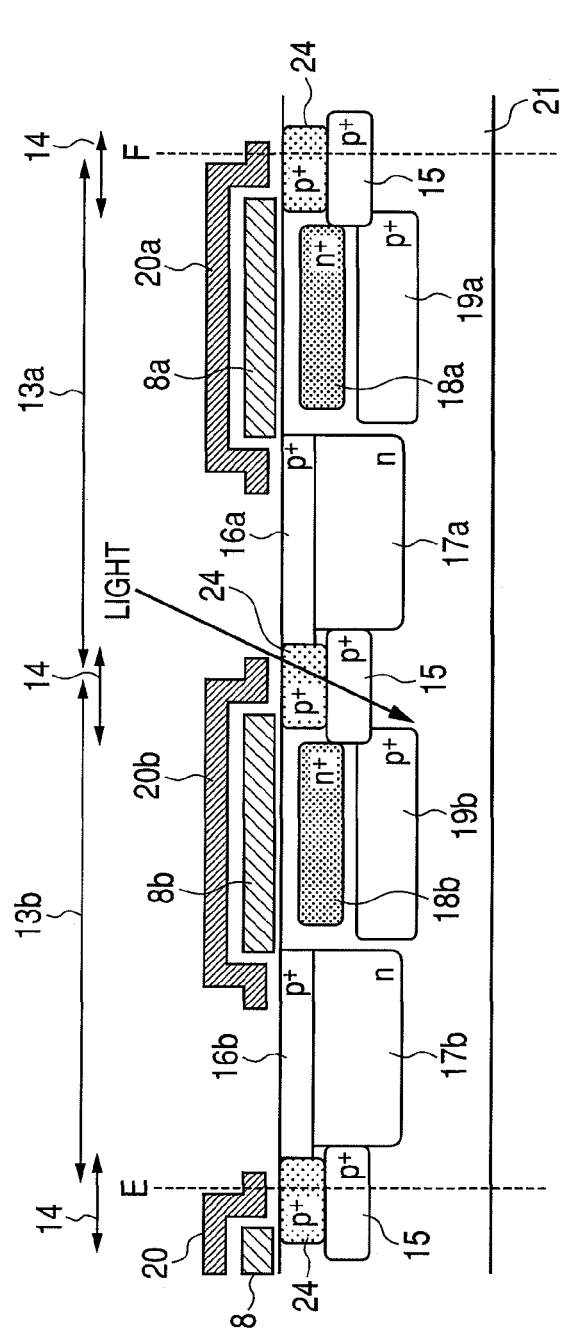
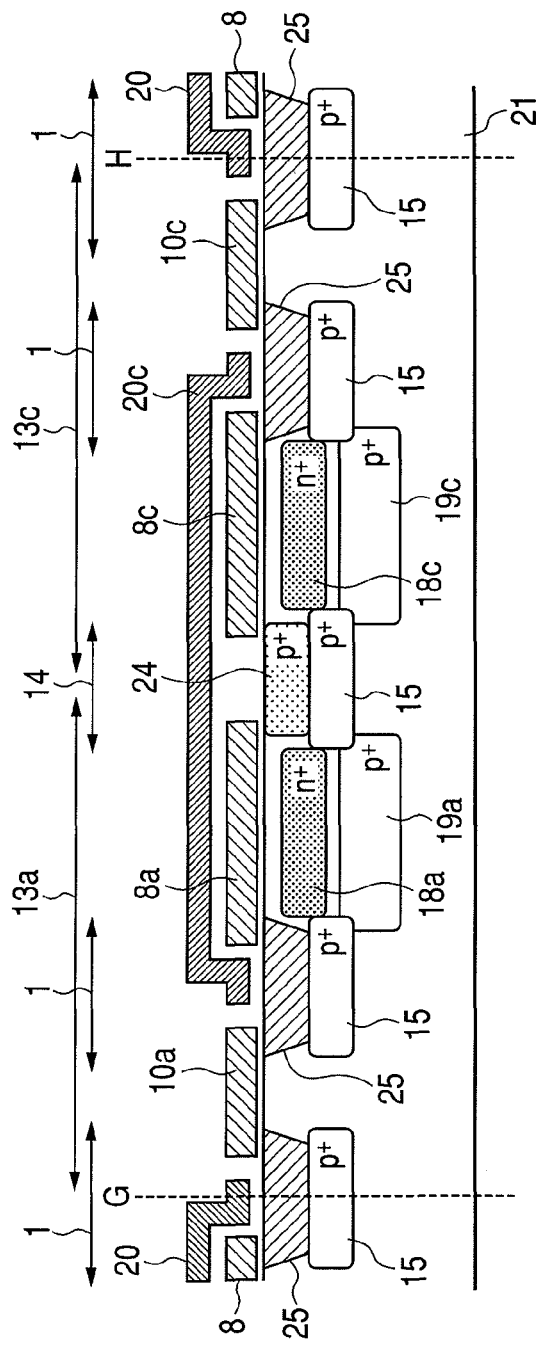
FIG. 5A
FIG. 5B

PHOTOELECTRIC CONVERSION APPARATUS AND IMAGING SYSTEM USING THE SAME

This application is a continuation of U.S. application Ser. No. 16/696,414, filed Nov. 26, 2019, which is a division of U.S. application Ser. No. 16/356,676, filed Mar. 18, 2019 (now U.S. Pat. No. 10,636,828 issued on Apr. 28, 2020), which is a division of U.S. application Ser. No. 15/207,289, filed Jul. 11, 2016 (now U.S. Pat. No. 10,283,356 issued on May 7, 2019), which is a division of U.S. application Ser. No. 13/797,276, filed Mar. 12, 2013 (now U.S. Pat. No. 9,419,038 issued on Aug. 16, 2016), which is a division of U.S. application Ser. No. 12/989,556, filed Oct. 25, 2010 (now U.S. Pat. No. 8,552,353, issued Oct. 8, 2013), which is a National Stage under § 371 of International Application No. PCT/JP2009/058949, filed May 7, 2009.

TECHNICAL FIELD

The present invention relates to an element isolation configuration in a photoelectric conversion apparatus including charge storing portions.

BACKGROUND ART

In recent years, many digital cameras and digital camcorders have used CCD-type or MOS-type photoelectric conversion apparatuses. For MOS-type photoelectric conversion apparatuses, element structures for delivering global shuttering that provides uniform accumulation time for photoelectric conversion portions have been developed. Such structures are components each including a charge storing portion for a photoelectric conversion portion. Japanese Patent Application Laid-Open No. 2007-053217 discloses a configuration in which components each including a charge storing portion each include an isolation region with a LOCOS structure. Also, Japanese Patent Application Laid-Open No. 2007-157912 discloses a configuration in which a gap are provided so as to surround each charge storing portion for reducing the amount of light incident on the charge storing portion in the component including the charge storing portion.

DISCLOSURE OF THE INVENTION

A photoelectric conversion apparatus according to an aspect of the present invention comprises a pixel unit including: a photoelectric conversion portion including at least a first photoelectric conversion element; a charge storing portion including at least a first charge storage element, and holding a charge generated in the photoelectric conversion portion; a plurality of transistors for outputting a signal based on the charge held by the charge storing portion; and an isolation area for electrically isolating the charge storing portion, wherein the isolation area includes a first isolation portion having a PN junction; and a second isolation portion having an insulator and arranged between the first charge storage element and at least a part of the plurality of transistors.

Also, am image pickup system according to another aspect of the present invention includes: the foregoing imaging apparatus, an optical system for forming an image on an imaging plane in the imaging apparatus; and a signal processing unit for processing signals output from the imaging apparatus to generate image data.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3A is a schematic cross-sectional view taken along line 3A-3A in FIG. 2.

FIG. 3B is a schematic cross-sectional view taken along line 3B-3B in FIG. 2.

FIG. 5A is a schematic cross-sectional view taken along line 5A-5A in FIG. 4.

FIG. 5B is a schematic cross-sectional view taken along line 5B-5B in FIG. 4.

The accompanying drawings, which are incorporated in and constitute a part of the specification, illustrate embodiments of the invention and, together with the description, serve to explain the principles of the invention.

BEST MODES FOR CARRYING OUT THE INVENTION

The present inventors have discovered that when light enters an isolation region in the structure disclosed in Japanese Patent Application Laid-Open No. 2007-053217, diffuse reflection of light occurs in the isolation region, resulting in the light entering the charge storing portion. Japanese Patent Application Laid-Open No. 2007-157912 discusses entrance of light around a wiring layer, but does not discuss the effect imposed on the charge storing portion when light enters the isolation region. However, for the isolation regions, it is necessary to consider not only the effect of light, but also electric characteristics such as pressure resistance and parasitic MOS. Therefore, an object of the present invention is to provide a photoelectric conversion apparatus that reduces intrusion of charges from isolation regions into charge storing portions.

The present invention relates to a photoelectric conversion apparatus including charge storing portions in its imaging region. In such photoelectric conversion apparatus, an isolation region for a charge storing portion includes a first isolation portion having a PN junction, and a second isolation portion having an insulator. The second isolation portion is arranged between the charge storing portion and a least a part of a plurality of transistors. The first isolation portion reduces the effect of diffuse reflection occurring in the isolation region having an oxide film, and arrangement of the second isolation portion between the charge storing portion and the transistors enables maintenance of pressure resistance of a readout circuit and the charge storing portion.

Hereinafter, exemplary embodiments will be described with reference to the drawings. The description will be provided considering signal charges as electrons.

First Exemplary Embodiment

Figure 1:
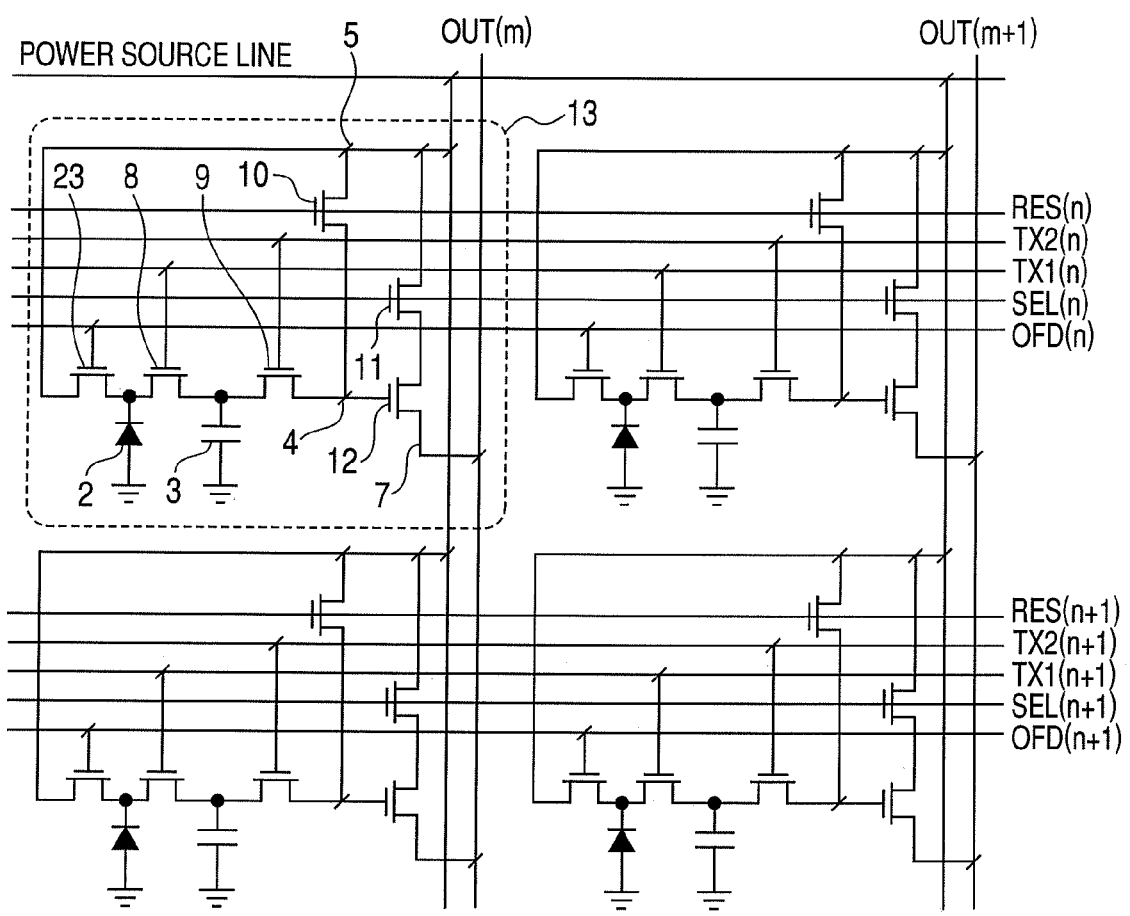
FIG. 1 illustrates an example of a pixel circuit in a photoelectric conversion apparatus.

First, an example of a pixel circuit in a photoelectric conversion apparatus including charge storing portions will be described with reference to FIG. 1. FIG. 1 illustrates a configuration in which pixels 13 each including a charge storing portion are arranged in two rows and two columns. Each pixel 13 includes a photoelectric conversion portion 2, a charge storing portion 3, a floating diffusion region 4, a power source portion 5, a pixel output portion 7, a first transfer gate electrode 8, a second gate electrode 9, a gate electrode 10 of a reset transistor, a gate electrode 11 of a selection transistor, a gate electrode 12 of an amplification transistor, and a gate electrode 23 of an overflow drain (hereinafter, "OFD"), which serves as a discharging portion. A power source line, which is a wiring for supply a predetermined voltage, is connected to the power source portion 5. Here, the power source portion 5 shares the same node with the drain of the reset transistor, the drain of the selection transistor and the drain of the OFD. Control lines RES, TX1, TX2, SEL and OFD supply pulses to the respective gate electrodes. The control line RES supplies pulses to the gate electrode 10 of the reset transistor, the control line TX1 supplies pulses to the first gate electrode 8, the control line TX2 supplies pulses to the second gate electrode 9, the control line SEL supplies pulses to the gate electrode 11 of the selection transistor, and the control line OFD supplies pulses to the gate electrode 23 of the overflow drain. A signal line OUT is also provided. The numbers n and m are positive integers: rows n and their respective adjacent rows n+1, and a column m and its adjacent column m+1 are illustrated. Here, a pixel 13, which is a component including one photoelectric conversion portion 2, is a minimum unit of repetition in the configuration of the photoelectric conversion apparatus. A region in which a plurality of the pixels 13 is arranged is referred to as an imaging region.

A global shutter in the pixels 13 described above operates as follows. After a lapse of certain accumulation time, charges generated in the photoelectric conversion portions 2 are transferred to the charge storing portions 3 by means of the first gate electrodes 8. During the signal charges for the certain accumulation time being held in the charge storing portions 3, the photoelectric conversion portions 2 start signal charge accumulation again. The signal charges in the charge storing portions 3 are transferred to the floating diffusion regions 4 by means of the second gate electrodes 9, and output from the pixel output portions 7 of the amplification transistors as signals. Also, in order to prevent the charges generated in the photoelectric conversion portions 2 during the signal charges being held in the charge storing portions 3 from intruding into the charge storing portions 3, the charges in the photoelectric conversion portions 2 may be discharged via the OFDs 23. Each reset transistor sets its floating diffusion region 4 to have a predetermined potential before the transfer of the signal charges from the charge storing portions 3 (reset operation). The potentials of the floating diffusion regions 4 at this point of time are output from the pixel output portions 7 as noise signals to differentiate the noise signals from signals based on signal charges that are output later, enabling removal of the noise signals.

Also, each pixel 13 may have a buried channel below its first gate electrode 8. In other words, the photoelectric conversion portions 2 and the charge storing portions 3 are electrically connected. A global shutter having such configuration operates as follows. Signal charges generated in the photoelectric conversion portions 2 are held in the photoelectric conversion portions 2 and the charge storing portions 3. After a lapse of certain accumulation time, the signal charges are transferred to the floating diffusion regions 4 by means of the second gate electrodes 9. After the transfer of the signal charges to the floating diffusion regions 4, the photoelectric conversion portions 2 and the charge storing portions 3 start signal charge accumulation again. In this configuration, also, in order to prevent the charges generated in the photoelectric conversion portions 2 during the signal charges being held in the floating diffusion regions 4 from intruding into the floating diffusion regions 4, the charges in the photoelectric conversion portions 2 may be discharged via the OFDs 23. Also, the operation of the reset transistors is similar to that in the foregoing case. This operation can be performed by means of driving the first gate electrodes 8 even though no buried channels are provided below the first gate electrodes 8. The present exemplary embodiment will be described taking such configuration provided with buried channels as an example.

Figure 2:
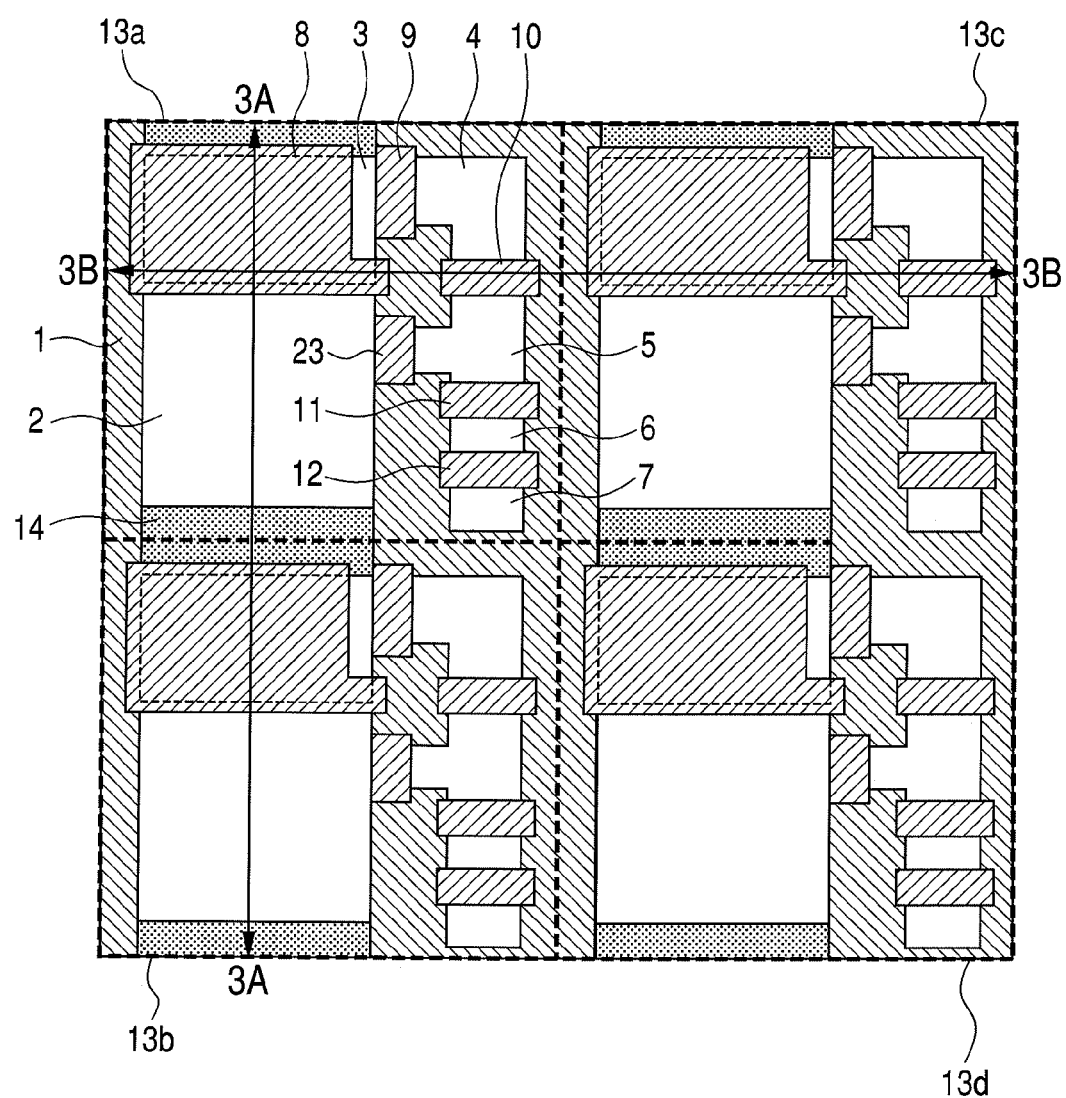
FIG. 2 is a schematic plan view of a photoelectric conversion apparatus for describing a first exemplary embodiment.

FIG. 2 is a schematic plan view of a photoelectric conversion apparatus with the pixel configuration illustrated in FIG. 1. The pixels 13 are arranged in two rows and two columns. The pixels 13 include a first pixel 13a, a second pixel 13b, a third pixel 13c and a fourth pixel 13d. Components having similar functions as those in FIG. 1 are provided with the same reference numerals and a description thereof will be omitted. Letters "a", "b", "c" and "d" in the reference numerals indicate that the relevant components are of the first pixel, the second pixel, the third pixel and the fourth pixel, respectively. Furthermore, for ease of description, arrangement of contacts and wirings other than the gate electrodes is not illustrated. The parts sharing the same node in FIG. 1 may be included in the same semiconductor region or may be connected via wirings.

FIG. 1 illustrates isolation regions 1 and 14. Each isolation region 14 is a first isolation portion having a PN junction in a semiconductor region, and each isolation region 1 is a second isolation portion having an insulator. The part other than the second isolation portion 1 is an active region where elements are formed.

A description will be provided focusing on the first pixel 13a. The first gate electrode 8a extends to an area above the charge storing portion 3a. As a result of the first gate electrode 8a extending to an area above the charge storing portion 3a, the amount of light incident on the charge storing portion 3a can be reduced, and the amount of dark current in the charge storing portion 3a can be reduced by controlling a voltage supplied to the first gate electrode 8a. Here, the charge storing portion 3a includes a first isolation portion 14 and a second isolation portion 1. The first isolation portion 14 is arranged between the charge storing portion 3a and an adjacent photoelectric conversion portion 2 (not illustrated). In other words, for example, a first isolation portion 14 is arranged between a charge storing portion 3b of the second pixel 13c and the charge storing portion 3a of the first pixel 13a. The configuration of such isolation regions will be described in details with reference to the schematic cross-sectional views in FIGS. 3A and 3B. Hereinafter, a description will be provided referring "n-type" as "first conductivity type".

FIG. 3A is a schematic cross-sectional view taken along line 3A-3A in FIG. 2, and FIG. 3B is a schematic cross-sectional view taken along line 3B-3B in FIG. 2. FIGS. 3A and 3B each illustrate a well 21. The well 21 may be either of n-type or p-type, and may also be a component provided on a semiconductor substrate or a semiconductor substrate. A second conductivity type first semiconductor region 16 and a first conductivity type second semiconductor region 17 constitute a photoelectric conversion portion 2. A first conductivity type third semiconductor region 18 constitutes a charge storing portion 3. A second conductivity type fourth semiconductor region 19 can function as a barrier for reducing the intrusion of electrons into the charge storing portion 3. A light shielding film 20 reduces the amount of light incident on the charge storing portion 3. In FIG. 2, the light shielding films 20 are omitted. A second conductivity type semiconductor region 22 constitutes a first isolation portion 14 for providing electrical isolation from the surrounding semiconductor regions, using PN junctions. The second conductivity type semiconductor region 14 has a higher concentration of second conductivity type impurities compared to those of the surrounding semiconductor regions, that is, has a high potential for signal carriers. Also, an insulator 23 constitutes a second isolation portion 1. The second isolation portion 1 is formed in a LOCOS (local oxidation of silicon) structure or an STI (shallow trench isolation) structure. A second conductivity type fifth semiconductor region 15 can function as a channel stop or a barrier for electrons. Furthermore, the fifth semiconductor region 15 may have a function that prevents dark current generated as a result of providing the insulator 23. Here, in the present exemplary embodiment, a first conductivity type sixth semiconductor region (not illustrated) is provided between the second semiconductor region 17 and the third semiconductor region 18. A buried channel is formed below the first gate electrode 8 by the sixth semiconductor region.

Figure 6A:
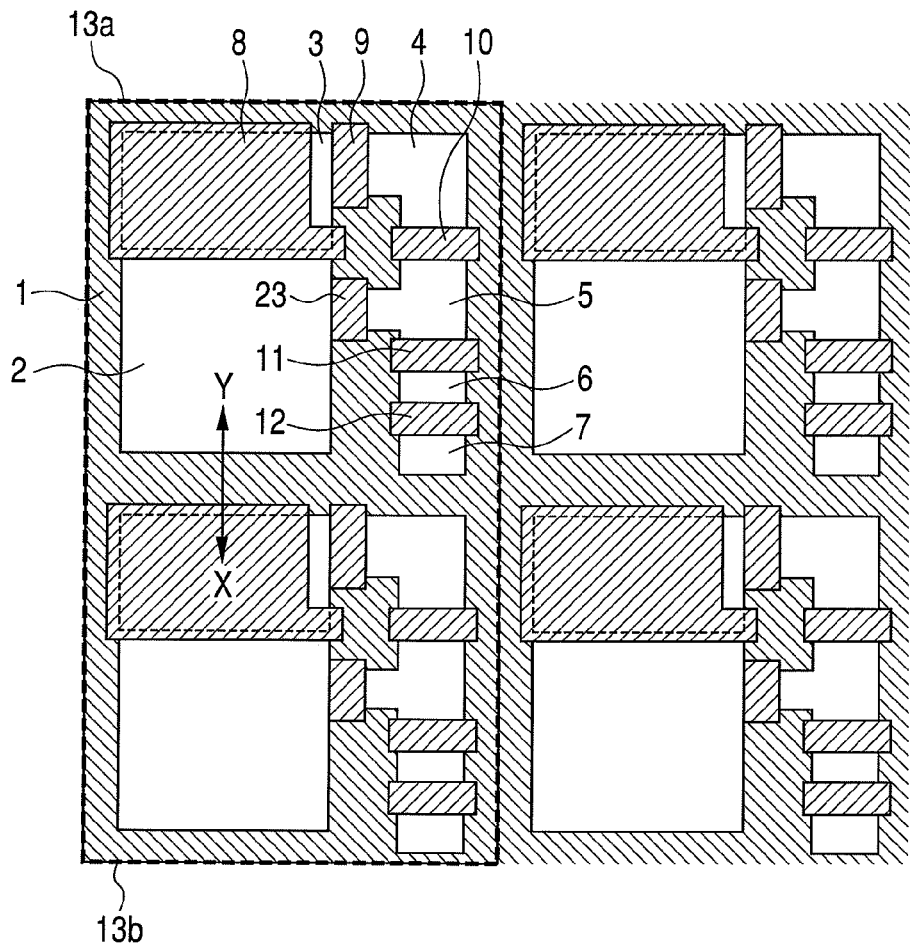
FIG. 6A is a schematic plan view of a photoelectric conversion apparatus for describing a first exemplary embodiment.
Figure 6B:
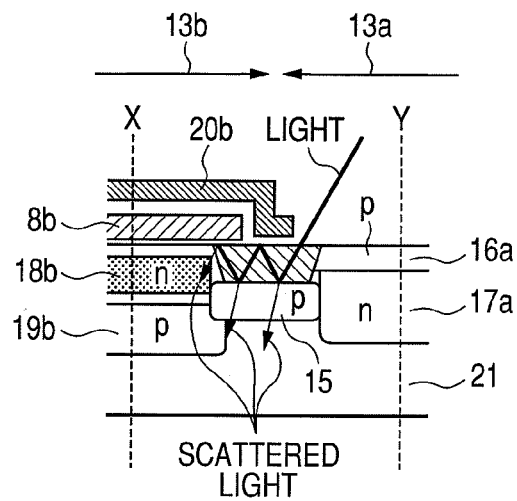
FIG. 6B is a schematic cross-sectional view of a photoelectric conversion apparatus for describing a first exemplary embodiment.

Here, a detailed description will be provided in relation to the object of the present invention with reference to FIGS. 6A and 6B. FIG. 6A is a schematic plan view corresponding to FIG. 2, and as with FIG. 2, corresponds to the pixel circuit in FIG. 1. FIG. 6B is a schematic cross-sectional view taken along line X-Y in FIG. 6A. The components similar to those in FIGS. 1 to 3B are provided with the same reference numerals, and a description thereof will be omitted. Here, in FIG. 6A, only the second isolation portions 1 each having an insulator are provided as isolation regions for the charge storing portions 3. In the cross-section along line X-Y in this case, a phenomenon as illustrated in FIG. 6B occurs. Since the photoelectric conversion portion 2a includes no light shielding film 20, light easily enters the photoelectric conversion portion 2a, resulting in light also enters between the photoelectric conversion portion 2a and the charge storing portion 3b. Here, the present inventors have discovered that when light enters a second isolation portion 1, reflection is repeated on the interface between the insulator and the semiconductor substrate 21, resulting in generation of scattered light running in variation directions. Electrons generated by this scattered light may intrude into signal charge held in the charge storing portion 3b, causing alias (error signal). In this case, if the isolation region is formed by an STI structure in which the insulator extends to a deep portion of the semiconductor substrate, reflection occurs more easily and thus, scattered light is easily generated. Also, light may enter the isolation region not only via the periphery of the photoelectric conversion portion 2a, but also via a cut of the light shielding film 20 even when the charge storing portion 3b is provided adjacent to the isolation region.

Meanwhile, in FIG. 3A, a first isolation portion 14 is provided between the charge storing portion 3b of the second pixel 13b and the photoelectric conversion portion 2a of the first pixel 13a. As illustrated in FIG. 3A, light easily enters the photoelectric conversion portion 2a provided with no light shielding film 20. As a result of providing the first isolation portion 14 in this part with a large amount of incident light, the light penetrates to a deep part of the well 21, reducing scattering. Also, the first isolation portion 14 enables reduction of intrusion of electrons generated by light into the third semiconductor region 18b constituting the charge storing portion 3b. Furthermore, the existence of a fourth semiconductor region 19b enables further reduction of intrusion of electrons into the third semiconductor region 18b.

Also, in FIG. 3B, a second isolation portion 1 is arranged between at least a part of a plurality of transistors (here, a reset transistor) and the charge storing portion 3a. Sufficient electric isolation can be provided by the second isolation portion 1. It should be noted that the transistor is not limited to the reset transistor: it is only necessary that the charge storing portion should not share the same node with the source or drain region of the transistor; and the transistor may be an amplification transistor or a selection transistor. Electric isolation and pressure resistance are needed because high pulses may be supplied to these transistor gate electrodes, and a high voltage may be the source or drain regions of the transistors. Furthermore, a second isolation portion may be arranged between a charge storing portion and a semiconductor region well for a well contact for fixing the potential. This is intended to provide sufficient electric isolation of the charge storing portion from the semiconductor region for the well contact because during reset operation, a high potential is applied to the charge storing portion.

Here, in many cases, a semiconductor region constituting the source or drain region of a transistor has a higher impurity concentration compared to that of a second semiconductor region 17 constituting a photoelectric conversion portion. If isolation of such semiconductor region having a high impurity concentration is provided by a first isolation portion, a large electric field will be applied to the PN junction interface. Accordingly, it is desirable to provide electric isolation while the pressure resistance being kept, by means of a second isolation portion 1. Furthermore, the plurality of transistors can block light, which is different from the photoelectric conversion portion 2, and thus, the amount of light incident on the second isolation portion 1 can be reduced, enabling reduction of generation of scattered light.

However, a second isolation portion 1 having an insulator may cause dark current, which arises from a defect in the lattice on the interface between the insulator and the semiconductor. Therefore, as in the present exemplary embodiment, a first isolation portion 14 is arranged near a charge storing portion 3 or a photoelectric conversion portion 2, which holds signal charges, enabling reduction of noise compared to the configuration illustrated in FIG. 6.

The above-described configuration enables provision of an imaging apparatus that reduces intrusion of charges from isolation regions into charge storing portions while having pressure resistance.

In a configuration in which a buried channel is provided between a photoelectric conversion portion 2 and a charge storing portion 3 as in the present exemplary embodiment, the time during which signal charges are held in the charge storing portion 3 become long, and thus, the configuration is effective for reduction of intrusion of electrons generated by incident light as well as reduction of dark current. However, the configuration in the present invention is not limited to one in which a buried channel is provided between a photoelectric conversion portion 2 and a charge storing portion 3. Furthermore, the fourth semiconductor region 19 and the fifth semiconductor region 15, which serve as barriers, may not be provided.

Second Exemplary Embodiment

A photoelectric conversion apparatus according to the present exemplary embodiment is different from that of the first exemplary embodiment in a plan layout of pixels, and has a configuration in which pixels are arranged symmetrically with reference to lines. Also, the photoelectric conversion apparatus is different from the first exemplary embodiment in arrangement of the isolation regions around the charge storing portions and photoelectric conversion portion. A description will be provided with reference to FIG. 4.

Figure 4:
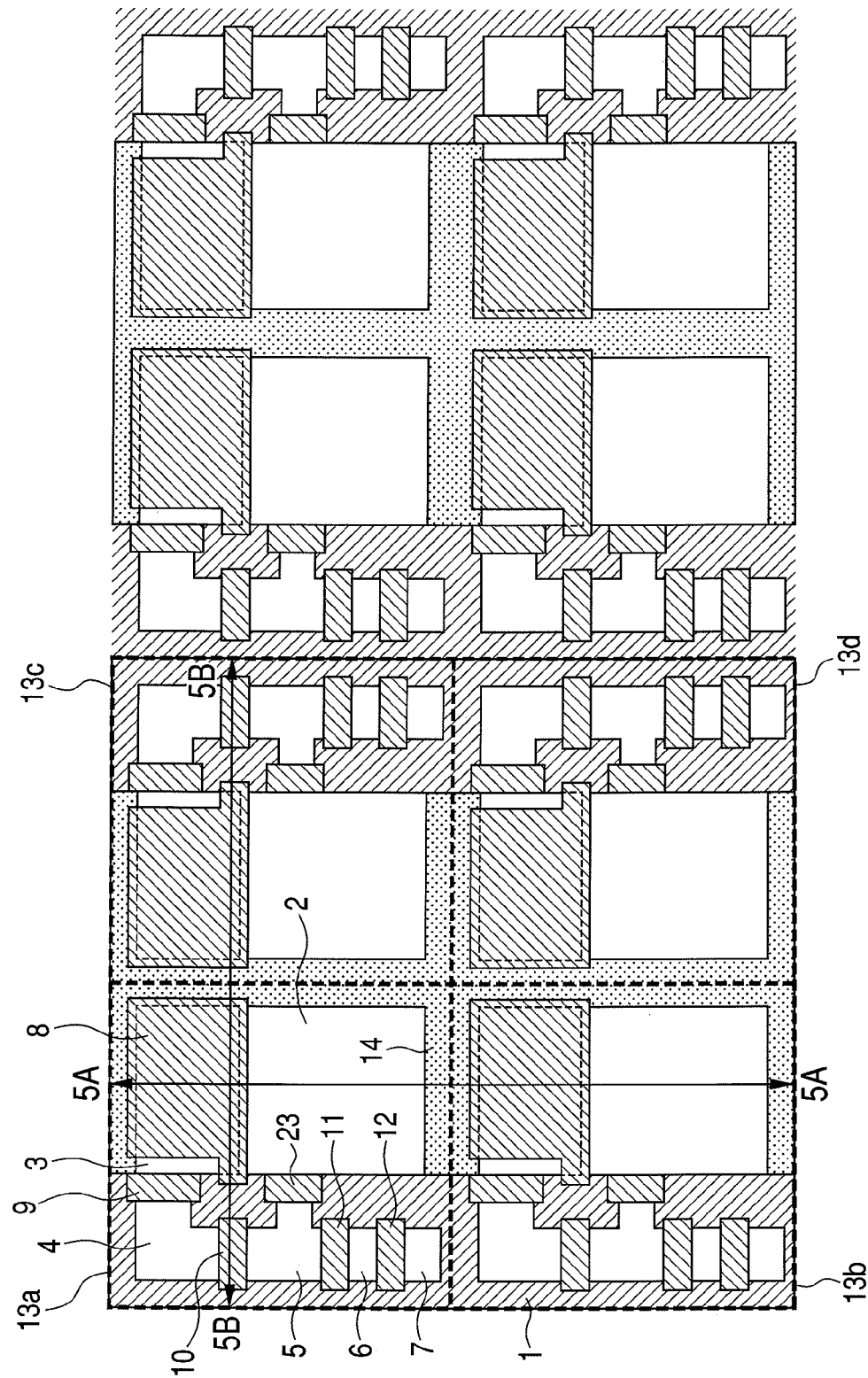
FIG. 4 is a schematic plan view of a photoelectric conversion apparatus for describing a second exemplary embodiment.

FIG. 4 is a schematic plan view of a photoelectric conversion apparatus. In FIG. 4, the same components as those in FIG. 2 are provided with the same reference numerals, and a description thereof will be omitted. For ease of description, contacts, wirings other than gate electrodes, and light shielding films are not illustrated. Although FIG. 4 illustrates eight pixels 13, which are arranged in two rows and four columns, the eight pixels in FIG. 4 are repeatedly arranged in two dimensions for the entire photoelectric conversion apparatus. A description will be provided using four pixels 13a, 13b, 13c and 13d from among the pixels. In FIG. 4, photoelectric conversion portions 2 of the first pixel 13a and the third pixel 13c arranged facing each other, which is different from FIG. 2. In other words, the column of the first pixel 13a and the second pixel 13b and the column of the third pixel 13c and the fourth pixel 13d are arranged symmetrically with reference to a line. Here, as in the first exemplary embodiment, a first isolation portion 14 is arranged between a charge storing portion 3a of the first pixel 13a and a photoelectric conversion portion of an adjacent pixel (not illustrated). A second isolation portion 1 is arranged between a transistor in the first pixel 13a and the charge storing portion 3a. However, the first isolation portion 14 is also arranged between the charge storing portion 3a of the first pixel 13a and a charge storing portion 3c of the third pixel 13c. Such configuration enables further reduction of charges intruding into the charge storing portion 3a compared to the first exemplary embodiment. Also, the configuration enables reduction of dark current intruding into the charge storing portion 3a. Also, the first isolation portion 14 is provided between a photoelectric conversion portion 2a and a photoelectric conversion portion 2c of the third pixel 13c. Such configuration enables reduction of dark current intruding into the photoelectric conversion portion 2a and the photoelectric conversion portion 2c. Also, a second isolation portion 1 is arranged between a transistor and the charge storing portion 3a or the photoelectric conversion portion 2a, enabling suppression of a decrease in pressure resistance and occurrence of parasitic MOS transistors. A description thereof will be provided with reference to the schematic cross-sectional view in FIG. 5.

FIG. 5A is a schematic cross-sectional view taken along line 5A-5A in FIG. 4, and FIG. 5B is a schematic cross-sectional view taken along the line 5B-5B in FIG. 4. In FIGS. 5A and 5B, the same components as those in FIGS. 3A and 3B are provided with the same reference numerals, and a further description will be omitted. A description of the configuration illustrated in FIG. 5A will be omitted because the configuration is almost the same as that in FIG. 3A. In FIG. 5B, the charge storing portion 3a of the first pixel 13a and the charge storing portion 3c of the third pixel 13c are adjacent to each other, and are blocked from light by the same light shielding film 20. By means of this light shielding film 20, no light enters between the charge storing portion 3a and the charge storing portion 3c. However, the first isolation portion 14, i.e., a second conductivity type semiconductor region 22, is arranged instead of an insulator 23 of the second isolation portion 1, which easily generates dark current. Such configuration enables reduction of dark current intruding into the charge storing portion 3a and the charge storing portion 3c.

As described above, a first isolation portion is arranged between a charge storing portion of a pixel and a charge storing portion of an adjacent pixel, enabling reduction of alias (error signal) due to light scattering occurring when a second isolation portion is arranged. Also, intrusion of dark current into the charge storing portions can be reduced. Also, similar advantages can be provided to the areas around photoelectric conversion portions by a similar arrangement. In addition to the above, a second isolation portion is provided between the charge storing portion and a transistor, enabling enhancement of pressure resistance and reduction of occurrence of a parasitic MOS transistor. It should be noted that the isolation region arrangement according to the present exemplary embodiment can also be applied to a different plan layout.

Third Exemplary Embodiment

Figure 7:
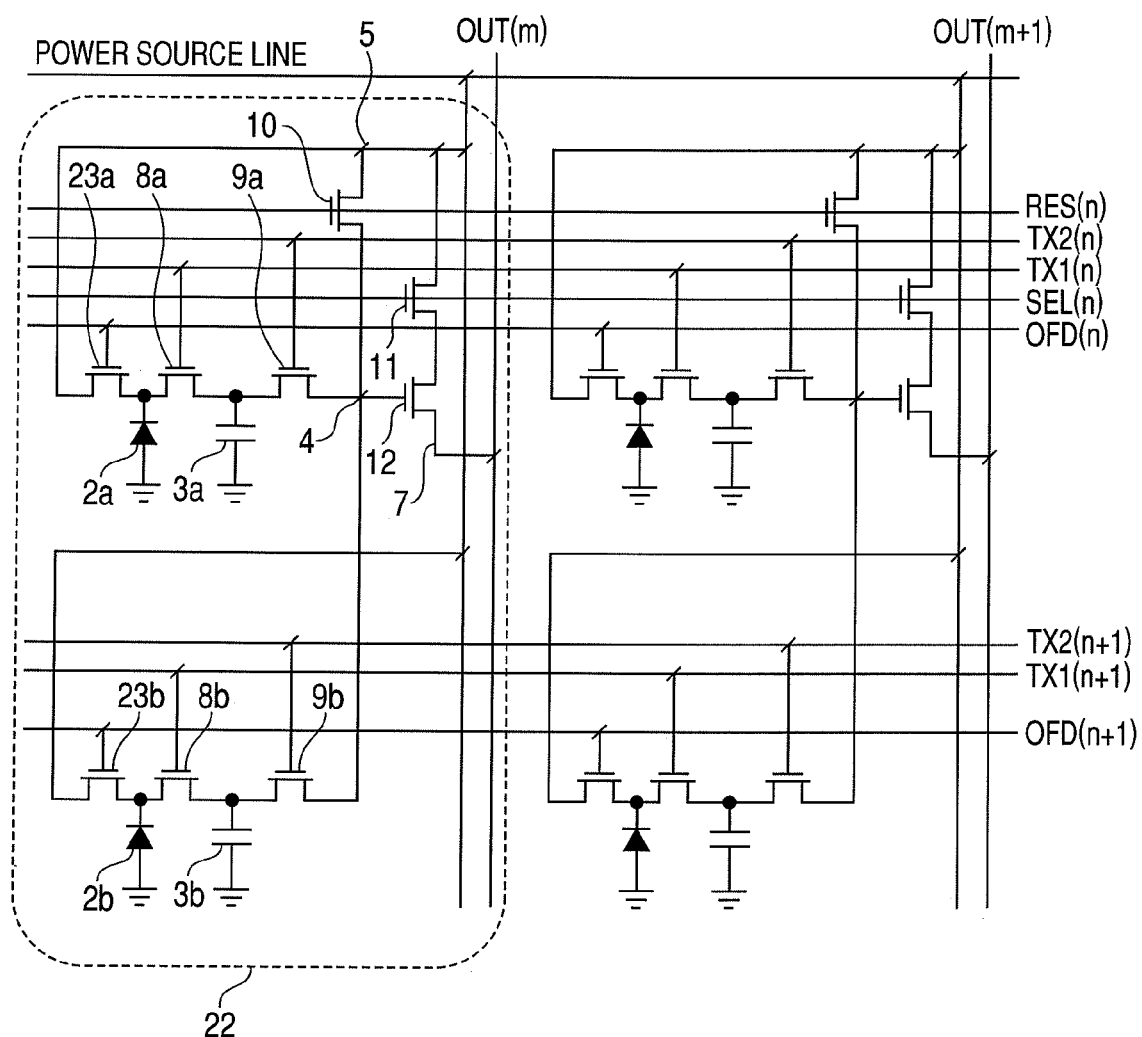
FIG. 7 illustrates another example of a pixel circuit in a photoelectric conversion apparatus.

For the present exemplary embodiment, a pixel circuit, which is different from that illustrated in FIG. 1, will be described with reference to FIG. 7. FIG. 7 illustrates a configuration including a pixel unit 22. The same components as those in FIG. 1 are provided with the same reference numerals and a description thereof will be omitted.

FIG. 7 illustrates a first photoelectric conversion element 2a, a second photoelectric conversion element 2b, a first charge storage element 3a and a second charge storage element 3b. A first gate electrode 8a and a second gate electrode 9a are provided for the first photoelectric conversion element, and a first gate electrode 8b and a second gate electrode 9b are provided for the second photoelectric conversion element. A discharging portion 23a is provided for the first photoelectric conversion element, and a discharging portion 23b is provided for the second photoelectric conversion element. The first photoelectric conversion element 2a and the second photoelectric conversion element 2b share a floating diffusion region 4, a reset transistor, a selection transistor and an amplification transistor.

In other words, the pixel circuit in FIG. 7 has a configuration in which the floating diffusion regions 4 of a pixel in the n-th row and the m-th column and a pixel in the n+1-th row and the m-th column in FIG. 1 are connected to each other. The reset transistor, the selection transistor and the amplification transistor are shared. Also, the configuration in FIG. 1 can be regarded as the case where the pixel unit 22 includes one photoelectric conversion portion 2.

According to the above-described configuration, the number of elements can be reduced compared to the configuration in FIG. 1, enabling the areas of the charge storing portions and the photoelectric conversion portions to be increased.

For arrangement of isolation regions in this case, as illustrated in the second exemplary embodiment, it is desirable to arrange second isolation portions between the charge storing portions and the transistors, and to arrange first isolation portions in the following areas: first, the areas between area charge storing portions, for example, the area between the first charge storage element 3a and the second charge storage element 3b, and the area between the first charge storage element 3a and a charge storing portion of an adjacent pixel unit; and furthermore, the areas between charge storing portions and photoelectric conversion portions, for example, the area between the first charge storage element 3a and the second photoelectric conversion element 2b, and the area between the first charge storage element 3a and a photoelectric conversion portion of an adjacent pixel unit. As described above, as a result of the first isolation portions and the second isolation portions being arranged as illustrated in the second exemplary embodiment, intrusion of charges into the charge storing portions can be reduced while maintaining pressure resistance.

(Application to an Imaging System)

The present exemplary embodiment will be described in terms of the case where a photoelectric conversion apparatus according to the first exemplary embodiment and the third exemplary embodiment is applied to an imaging system, with reference to FIG. 8. An imaging system may be a digital still camera, a digital video camera, or a digital camera for a mobile phone.

Figure 8:
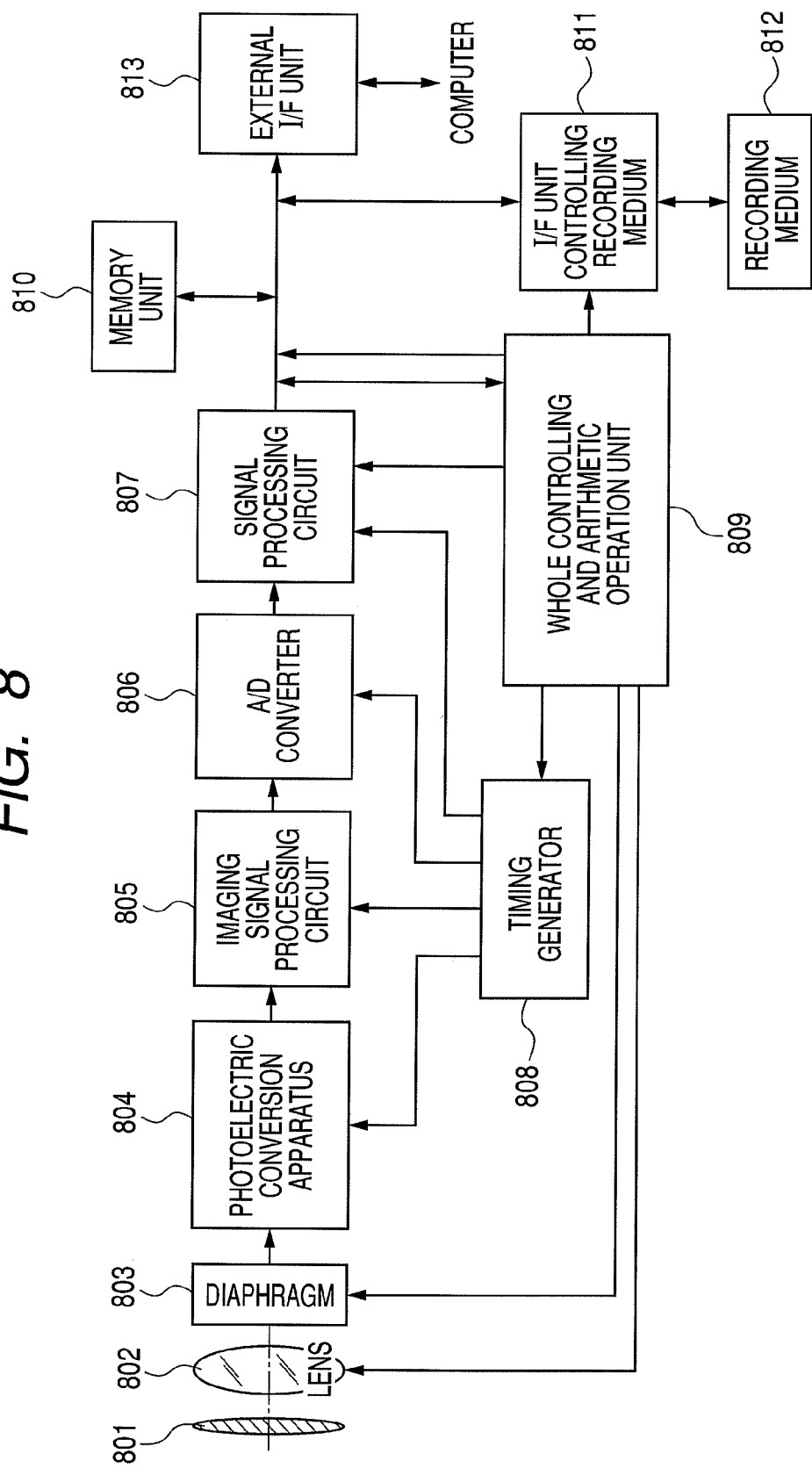
FIG. 8 is a block diagram for describing an imaging system.

FIG. 8 is a diagram illustrating the configuration of a digital still camera. An optical image of a subject is formed on an imaging plane in a photoelectric conversion apparatus 804 via an optical system including a lens 802. Outside the lens 802, a barrier 801, which provides a protection function for the lens 802 and also serves as a main switch, may be provided. A diaphragm 803 for adjusting the amount of light emitted from the lens 802 may be provided to the lens 802. Imaging signals output from the photoelectric conversion apparatus 804 via a plurality of channels are subjected to processing such as various corrections and clamping, by means of an imaging signal processing circuit 805. Analog-digital conversion of the imaging signals output from the imaging signal processing circuit 805 via the plurality of channels is performed by means of an A/D converter 806. The image data output from the A/D converter 806 is subjected to various corrections, data compression, etc., by means of a signal processing unit (image processing unit) 807. The photoelectric conversion apparatus 804, the imaging signal processing circuit 805, the A/D converter 806 and the signal processing unit 807 operate according to a timing signal generated by a timing generator 808. Each block is controlled by a whole controlling and arithmetic operation unit 809. The digital still camera further includes a memory unit 810 for temporarily storing image data, and a recording medium control I/F unit 811 for recording/reading images in/from a recording medium. A recording medium 812 includes, e.g., a semiconductor memory, can be attached/detached. The digital still camera may further include an external interface (I/F) unit 813 for communication with external computers, etc. Here, the imaging signal processing circuit 805, the A/D converter 806 and the signal processing unit 807 and the timing generator 808 may be formed on the same chip as one on which the photoelectric conversion apparatus 804 is formed.

Next, operation in FIG. 8 will be described. In response to the barrier 801 being opened, main power, power for a control system, and power for imaging system circuits such as the A/D converter 806 are sequentially turned on. Subsequently, in order to control the exposure amount, the whole controlling and arithmetic operation unit 809 makes the diaphragm 803 open. Signals output from the photoelectric conversion apparatus 804 pass through the imaging signal processing circuit 805 and are provided to the A/D converter 806. The A/D converter 806 performs A/D conversion of the signals and outputs the signals to the signal processing unit 807. The signal processing unit 807 processes the data and provides the data to the whole controlling and arithmetic operation unit 809, and the whole controlling and arithmetic operation unit 809 performs an arithmetic operation to determine the exposure amount. The whole controlling and arithmetic operation unit 809 controls the diaphragm based on the determined exposure amount.

Next, the whole controlling and arithmetic operation unit 809 extracts high-frequency components from the signals output from the photoelectric conversion apparatus 804 and then processed by the signal processing unit 807, and performs an arithmetic operation to determine the distance to the subject based on the high-frequency components. Subsequently, the lens 802 is driven and whether or not the camera is in focus is determined. If the camera is determined as not in focus, the lens 802 is driven and an arithmetic operation to determine the distance is performed again.

After confirming that the camera is in focus, exposure starts. After the end of the exposure, the imaging signals output from the photoelectric conversion apparatus 804 are subjected to, e.g., correction, in the imaging signal processing circuit 805, subjected to A/D conversion in the A/D converter 806, and are processed in the signal processing unit 807. The image data processed in the signal processing unit 807 are accumulated in the memory unit 810 by means of the whole controlling and arithmetic operation unit 809. Subsequently, the image data accumulated in the memory unit 810 is recorded in the recording medium 812 via the record medium control I/F unit by means of the whole controlling and arithmetic operation unit 809's control. The image data is also provided to, e.g., a computer via the external I/F unit 813 and processed.

As described above, a photoelectric conversion apparatus according to the present invention is applied to an imaging system. As a result of using a photoelectric conversion apparatus according to the present invention, noise superimposed on image signals as a result of use of a global shutter can be reduced, enabling provision of higher-quality images. Also, noise removal in, e.g., a signal processing circuit can be facilitated.

Several exemplary embodiments of the present invention have been described above. However, the present invention will not be limited to the exemplary embodiments and appropriate modifications are possible. For example, the pixel circuit configuration is not limited the configuration in FIG. 1. The configuration may be a configuration in which charges are discharged in a vertical direction of the semiconductor substrate, rather than from the discharging portion illustrated in FIG. 1. Also, the configuration of the first gate electrode 8 is not limited to those described for the exemplary embodiments, and the first gate electrode 8 may not extend to the area above the charge storing portion 3. The polarities of the charges, the semiconductor regions and the transistors may appropriately be changed. Also, any appropriate combination of the exemplary embodiments is possible.

While the present invention has been described with reference to exemplary embodiments, it is to be understood that the invention is not limited to the disclosed exemplary embodiments.

This application claims the benefit of Japanese Patent Application No. 2008-123440, filed May 9, 2008, which is hereby incorporated by reference in its entirety.

The invention claimed is:

1. A photoelectric conversion apparatus comprising:
a first photoelectric conversion portion including a first semiconductor region of a first conductive type;
a second photoelectric conversion portion including a second semiconductor region of the first conductive type;
a first region where a first storage portion configured to hold a signal based on a charge generated by the first photoelectric conversion portion is arranged;
a second region where a second storage portion configured to hold a signal based on a charge generated by the second photoelectric conversion portion is arranged;
a first floating diffusion portion arranged at different location from the first storage portion and configured to hold a signal based on a charge generated by the first photoelectric conversion portion;
a first electrode arranged in the first region in a plan view;
a second electrode arranged in the second region in the plan view; and
a first transistor connected to the first floating diffusion portion, the first transistor being one of a reset transistor, an amplification transistor, and a selection transistor,
wherein a first element isolation portion using an insulator is arranged between the first transistor and the first photoelectric conversion portion, and
wherein the first electrode and the second electrode are arranged on a same active region.

2. The photoelectric conversion apparatus according to claim 1,
wherein the first electrode is disposed so as to overlap with at least a part of the first element isolation portion.

3. The photoelectric conversion apparatus according to claim 1, wherein the first element isolation portion is arranged between the first transistor and the first electrode in the plan view.

4. The photoelectric conversion apparatus according to claim 2, the same active region is not separated by the first element isolation portion.

5. The photoelectric conversion apparatus according to claim 4, further comprising a first discharging portion configured to discharge a charge generated in the first photoelectric conversion portion and a second discharging portion configured to discharge a charge generated in the second photoelectric conversion portion,
wherein the first photoelectric conversion portion and the second photoelectric conversion portion are arranged between the first discharging portion and the second discharging portion in the plan view.

6. The photoelectric conversion apparatus according to claim 5, further comprising a third photoelectric conversion portion including a third semiconductor region of the first conductive type, a third region where a third storage portion configured to hold a signal based on a charge generated by the third photoelectric conversion portion is arranged, a third floating diffusion portion arranged at different location from the third storage portion and configured to hold a signal based on a charge generated by the third photoelectric conversion portion, and a third electrode arranged in the third region in the plan view,
wherein the first photoelectric conversion portion and the second photoelectric conversion portion are arranged on a first line along a first direction,
wherein the first photoelectric conversion portion and the third photoelectric conversion portion are arranged on a second ling along a second line, the second line being crossing to the first line, and
wherein the third electrode is arranged on an another active region different from the same active region.

7. The photoelectric conversion apparatus according to claim 3, further comprising a second floating diffusion portion arranged at different location from the second storage portion and configured to hold a signal based on a charge generated by the second photoelectric conversion portion, and
wherein the first floating diffusion region is separated from the second floating diffusion region in the plan view.

8. The photoelectric conversion apparatus according to claim 6, wherein the first element isolation portion is formed in a shallow trench isolation structure.

9. The photoelectric conversion apparatus according to claim 5,
wherein the first photoelectric conversion portion and the second photoelectric conversion portion share the first transistor.

10. The photoelectric conversion apparatus according to claim 9,
wherein the first region includes a third semiconductor region of the first conductivity type, and the second region includes a fourth semiconductor region of the first conductivity type.

11. The photoelectric conversion apparatus according to claim 10, further comprising
wherein a second element isolation portion using a PN junction arranged between the first semiconductor region and the second semiconductor region, and
wherein the second element isolation portion does not include an insulator.

12. The photoelectric conversion apparatus according to claim 1, further comprising
wherein a second element isolation portion using a PN junction arranged between the first semiconductor region and the second semiconductor region, and
wherein the second element isolation portion does not include an insulator.

13. The photoelectric conversion apparatus according to claim 7, further comprising a third photoelectric conversion portion including a third semiconductor region of the first conductive type, a third region where a third storage portion configured to hold a signal based on a charge generated by the third photoelectric conversion portion is arranged, a third floating diffusion portion arranged at different location from the third storage portion and configured to hold a signal based on a charge generated by the third photoelectric conversion portion, and a third electrode arranged in the third region in the plan view,
wherein the first photoelectric conversion portion and the second photoelectric conversion portion are arranged on a first line along a first direction,
wherein the first photoelectric conversion portion and the third photoelectric conversion portion are arranged on a second line along a second line, the second line being crossing to the first line, and wherein the third electrode is arranged on an another active region different from the same active region.

14. The photoelectric conversion apparatus according to claim 12, further comprising a third photoelectric conversion portion and a fourth photoelectric conversion portion,
wherein the first photoelectric conversion portion, the second photoelectric conversion portion, the third photoelectric conversion portion, and the fourth photoelectric conversion portion are arranged in one active region.

15. The photoelectric conversion apparatus according to claim 1,
wherein the first semiconductor region and the first electrode are arranged symmetrically to the second semiconductor region and the second electrode, with reference to a line perpendicular to a line passing through the first and second semiconductor regions, in the plan view.

16. A camera comprising:
the photoelectric conversion apparatus according to claim 1; and
an A/D converter performing analog-digital conversion of the imaging signals output from the photoelectric conversion apparatus.

17. A camera comprising:
the photoelectric conversion apparatus according to claim 10; and
an A/D converter performing analog-digital conversion of the imaging signals output from the photoelectric conversion apparatus.

18. A camera comprising:
the photoelectric conversion apparatus according to claim 13; and
an A/D converter performing analog-digital conversion of the imaging signals output from the photoelectric conversion apparatus.

19. The camera according to claim 16, further comprising a timing generator controlling the timing of the photoelectric conversion apparatus and a memory unit.

20. The camera according to claim 17, further comprising a timing generator controlling the timing of the photoelectric conversion apparatus and a memory unit.

21. The camera according to claim 18, further comprising a timing generator controlling the timing of the photoelectric conversion apparatus and a memory unit.

22. The camera according to claim 19, further comprising an optical system configured to form an image of a subject on the photoelectric conversion apparatus.

23. The camera according to claim 20, further comprising an optical system configured to form an image of a subject on the photoelectric conversion apparatus.

24. The camera according to claim 21, further comprising an optical system configured to form an image of a subject on the photoelectric conversion apparatus.

25. A photoelectric conversion apparatus comprising:
a first photoelectric conversion portion including a first semiconductor region of a first conductive type;
a second photoelectric conversion portion including a second semiconductor region of the first conductive type;
a first storage portion configured to hold a signal based on a charge generated by the first photoelectric conversion portion;
a second storage portion configured to hold a signal based on a charge generated by the second photoelectric conversion portion;
a first floating diffusion portion arranged at different location from the first storage portion and configured to hold a signal based on a charge generated by the first photoelectric conversion portion;
a second floating diffusion portion arranged at different location from the second storage portion and configured to hold a signal based on a charge generated by the second photoelectric conversion portion;
a first transistor connected to the first floating diffusion portion, the first transistor being one of a reset transistor, an amplification transistor, and a selection transistor;
a second transistor connected to the second floating diffusion portion, the second transistor being one of a reset transistor, an amplification transistor, and a selection transistor,
an element isolation portion,
wherein the element isolation portion has a first element isolation portion using a PN junction arranged between the first semiconductor region and the second semiconductor region, a second element isolation portion using an insulator arranged between the first semiconductor region and the first transistor, and
wherein the first element isolation portion does not include an insulator.

26. The photoelectric conversion apparatus according to claim 25,
wherein the first transistor is the amplification transistor configured to output a signal based on the charge held by the first storage portion, and
wherein the second transistor is the amplification transistor configured to output a signal based on the charge held by the second storage portion.

27. The photoelectric conversion apparatus according to claim 26, wherein the first element isolation portion is arranged between the first photoelectric conversion portion and the first storage portion in the plan view.

28. The photoelectric conversion apparatus according to claim 27, wherein the second element isolation portion is formed in a shallow trench isolation structure.

29. The photoelectric conversion apparatus according to claim 27, further comprising a first selection transistor and a first reset transistor,
wherein a portion of the first transistor, a portion of the first selection transistor, and a portion of the first reset transistor are arranged in a first active region.

30. The photoelectric conversion apparatus according to claim 29, further comprising a second selection transistor and a second reset transistor,
wherein a portion of the second transistor, a portion of the second selection transistor, and a portion of the second reset transistor are arranged in the first active region.

31. The photoelectric conversion apparatus according to claim 30, further comprising a first transfer transistor controlling transfer of a charge held by the first storage portion, and a second transfer transistor controlling transfer of a charge held by the second storage portion.

32. The photoelectric conversion apparatus according to claim 30, further comprising a first gate electrode of a third transfer transistor, the third transfer transistor controlling transfer of a charge held by the first semiconductor region.

33. The photoelectric conversion apparatus according to claim 32, further comprising a second gate electrode of a fourth transfer transistor controlling transfer of a charge held by the second semiconductor region.

34. The photoelectric conversion apparatus according to claim 33, wherein the first semiconductor region and the first gate electrode are arranged symmetrically to the second semiconductor region and the second gate electrode, with reference to a line perpendicular to a line passing through the first and second semiconductor regions, in a plan view.

35. The photoelectric conversion apparatus according to claim 34, wherein the first gate electrode is disposed so as to cover the first storage portion in the plan view.

36. The photoelectric conversion apparatus according to claim 35, wherein the first gate electrode is extended beyond an outer edge of the first storage portion, in the plan view, and the outer edge of the first storage portion is along a direction in which the first semiconductor region and the first storage portion abut side-by-side.

37. A camera comprising:
the photoelectric conversion apparatus according to claim 25; and
an A/D converter performing analog-digital conversion of the imaging signals output from the photoelectric conversion apparatus.

38. The camera according to claim 37, further comprising a timing generator controlling the timing of the photoelectric conversion apparatus.

39. The camera according to claim 38, further comprising a memory unit.

40. The camera according to claim 39, further comprising an optical system configured to form an image of a subject on the photoelectric conversion apparatus.

41. The photoelectric conversion apparatus according to claim 25,
wherein each of the first transistor and the second transistor is connected to power node.

42. The photoelectric conversion apparatus according to claim 41,
wherein the first electrode is disposed so as to overlap the second element isolation portion.

43. The photoelectric conversion apparatus according to claim 42, further comprising a third electrode and a fourth electrode,
wherein the third electrode configured to control the electrical connection between the first floating diffusion region and the first storage portion, and
wherein the fourth electrode configured to control the electrical connection between the second floating diffusion region and the second storage portion.

44. The photoelectric conversion apparatus according to claim 43,
wherein the first transistor is an amplification transistor,
wherein the photoelectric conversion apparatus further comprises a selection transistor and a reset transistor, and wherein a portion of the amplification transistor, a portion of the selection transistor, and a portion of the reset transistor are arranged in a first active region.

45. The photoelectric conversion apparatus according to claim 44, further comprising a third photoelectric conversion portion,
wherein the first transistor configured to output the signal generated by the first photoelectric conversion portion and a signal based on a charge generated by the third photoelectric conversion portion.

46. The photoelectric conversion apparatus according to claim 45, further comprising a fourth photoelectric conversion portion,
wherein the second transistor configured to output the signal generated by the second photoelectric conversion portion and a signal based on a charge generated by the fourth photoelectric conversion portion.

47. The photoelectric conversion apparatus according to claim 46,
wherein the first photoelectric conversion portion and the third photoelectric conversion portion share the selection transistor and the reset transistor.

48. The photoelectric conversion apparatus according to claim 47,
wherein the first photoelectric conversion portion, the second photoelectric conversion portion, the third photoelectric conversion portion, and the fourth photoelectric conversion portion are arranged in one active region.

49. The photoelectric conversion apparatus according to claim 48,
wherein the first semiconductor region and the first electrode are arranged symmetrically to the second semiconductor region and the second electrode, with reference to a line perpendicular to a line passing through the first and second semiconductor regions, in the plan view.

50. A camera comprising:
the photoelectric conversion apparatus according to claim 49; and
an A/D converter performing analog-digital conversion of the imaging signals output from the photoelectric conversion apparatus.

51. The camera according to claim 50, further comprising a timing generator controlling the timing of the photoelectric conversion apparatus.

52. The camera according to claim 51, further comprising a memory unit.

53. The camera according to claim 52, further comprising an optical system configured to form an image of a subject on the photoelectric conversion apparatus.

* * * * *